(12) United States Patent
Esterl et al.

(10) Patent No.: US 6,445,607 B2
(45) Date of Patent: Sep. 3, 2002

(54) METHOD FOR OPERATING AN INTEGRATED MEMORY

(75) Inventors: Robert Esterl, München (DE); Heinz Hönigschmid, East Fishkill, NY (US); Helmut Kandolf, München (DE); Thomas Röhr, Yokohama (JP)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/829,288

(22) Filed: Apr. 9, 2001

(30) Foreign Application Priority Data

Apr. 7, 2000 (DE) .......................... 100 17 368

(51) Int. Cl.$^7$ ............................................. G11C 11/22
(52) U.S. Cl. ........................................ 365/145; 365/149
(58) Field of Search ................................ 365/145, 149

(56) References Cited

U.S. PATENT DOCUMENTS

| 4,420,822 A | 12/1983 | Koomen et al. ............ 365/182 |
| 5,241,266 A | 8/1993 | Ahmad et al. ............... 324/158 |
| 5,835,400 A | 11/1998 | Jeon et al. ................... 365/145 |
| 6,330,178 B1 * | 12/2001 | Sakata et al. ................ 365/145 |

FOREIGN PATENT DOCUMENTS

| DE | 198 32 994 A1 | 1/2000 | |
| EP | 0 917 151 A2 * | 5/1999 | |
| JP | 405006653 * | 1/1993 | ........... G11C/11/22 |
| JP | 405028774 * | 2/1993 | ........... G11C/11/56 |

OTHER PUBLICATIONS

Betty Prince, "Semiconductor Memories", 1983, Wiley, 2$^{nd}$ edition pp. 654–656.*
Claus Reuber: "Laserstrahl statt Prüfspitze", ["Laser beam instead of probe tip"], Elektronik 24/1997, pp. 96–102;

* cited by examiner

Primary Examiner—M. Tran
(74) Attorney, Agent, or Firm—Laurence A. Greenberg; Werner H. Stemer; Gregory L. Mayback

(57) ABSTRACT

A description is given of a method for operating an integrated memory which has memory cells each having a selection transistor and a storage capacitor with a ferroelectric storage effect. The memory contains a plate line, which is connected to one of the column lines via a series circuit containing a selection transistor and a storage capacitor of respective memory cells. A memory access is carried out according to the "pulsed plate concept". In this case, the temporal sequence is controlled in such a way that, in an access cycle, the storage capacitor of the memory cell to be selected is in each case charged and discharged by the same amount. An attenuation or destruction of the information stored in the memory cells, which is caused by source-drain leakage currents of unactivated selection transistors, is thus avoided.

3 Claims, 3 Drawing Sheets

US 6,445,607 B2

1

METHOD FOR OPERATING AN INTEGRATED MEMORY

BACKGROUND OF THE INVENTION

FIELD OF THE INVENTION

The present invention relates to a method for operating an integrated memory having a memory cell array which has column lines and row lines. The memory has memory cells which each have a selection transistor and a storage capacitor with a ferroelectric storage effect, and a plate line, which is connected to one of the column lines via a series circuit containing the selection transistor and the storage capacitor of respective memory cells, in which control terminals of the selection transistors of the memory cells are connected to a respective one of the row lines.

Integrated memories having what are referred to as FeRAM memory cells, which have a ferroelectric storage effect, are often constructed in a similar manner to dynamic random access memories (DRAMs), for example. In that case, the memory cells are usually combined in a matrix-type memory cell array to form units of column lines and row lines. The memory cells each contain a selection transistor and a storage capacitor. In this case, the control terminals of the respective selection transistors of the memory cells are connected to a respective one of the row lines. The column lines are generally connected to a sense amplifier, at which an evaluated and amplified data signal can be picked off.

In memory cells with a ferroelectric storage effect, data signals are stored, as is known, in the form of different polarization states of the material in a storage capacitor of the memory cell. During operation of the memory, the memory cells generally have a capacitive behavior. Integrated memories having memory cells of this type are known for example as "FeRAMS". In this case, the memory cells or their series circuit containing the selection transistor and the storage capacitor are usually connected between one of the column lines and a plate line, also referred to as "plate". The plate line is usually connected to a driver circuit through which the plate line is present at a predetermined potential.

During operation of the integrated memory, the column lines and the plate lines of the memory each have active or inactive operating modes. In an active operating mode in which, for example, the content of one of the memory cells is read out, the corresponding selection transistor is activated and the corresponding column line is connected to a sense amplifier. The plate line is present at a predetermined potential. Therefore, there is a differential voltage present between the plate line and the corresponding column line. In an inactive operating mode, the corresponding column lines and the plate lines are generally connected to a terminal for a common supply potential.

During an access cycle, a differential voltage between the respective column line and the plate line is likewise present, across the respective source-drain paths of unactivated selection transistors of unselected memory cells. This source-drain voltage can cause a "leakage current" in the respective selection transistor. During each access cycle, the associated storage capacitors of unselected memory cells are charged and/or discharged by certain quantities of charge. As a result, the voltage across the respective storage capacitor can change during each access cycle.

In a ferroelectric memory, the information in a memory cell is stored by the amount of remnant polarization, no

2 voltage being present between the terminals of the storage capacitor. The read-out of the information is achieved by momentarily applying a voltage to the terminals of the capacitor. As a result of the above-described charging or discharging of the storage capacitor on account of a leakage current and as a result of the associated change in potential across the capacitor, the information stored in the memory cell can be attenuated or destroyed over time or after a plurality of access cycles.

SUMMARY OF THE INVENTION

It is accordingly an object of the invention to provide a method for operating an integrated memory which overcomes the above-mentioned disadvantages of the prior art devices of this general type, in which an attenuation or destruction of the information stored in a memory cell, which is caused by source-drain leakage currents of selection transistors, is avoided.

With the foregoing and other objects in view there is provided, in accordance with the invention, an operating method which includes providing an integrated memory having a memory cell array of memory cells, column lines, and row lines. The memory cells have selection transistors and storage capacitors with a ferroelectric storage effect. The integrated memory further has a plate line connected to one of the column lines through a series circuit containing a selection transistor and a storage capacitor of each of the memory cells. The selection transistors have control terminals each connected to a respective one of the row lines, and the memory cells can be accessed in an access cycle. Prior to an access, a column line and the plate line connected. to a memory cell to be selected are set to an initial potential. During the access, a row line connected to the memory cell to be selected is activated, with a result that the selection transistor of the memory cell is switched on. A further potential is applied to the plate line, the further potential being different from the initial potential of the column line. A potential present on the column line at a first instant is evaluated and amplified. The initial potential is applied to the plate line at a second instant. The initial potential is applied to the column line at a third instant. The first instant, the second instant and the third instant are chosen such that, in the access cycle, the storage capacitor of the memory cell to be selected is in each case charged and discharged by an equivalent amount.

The ferroelectric memory is operated in a "pulsed plate concept", in which the plate line has pulsed signals. In order to avoid a loss of information in unselected memory cells, the time sequence of an access cycle is controlled in a suitable manner. If, for this purpose, the first instant, the second instant and the third instant are chosen such that the selected storage capacitor is in each case charged and discharged by the same amount, then this effect is also achieved in the case of unselected storage capacitors which are charged and/or discharged on account of source-drain leakage currents. If an access cycle is temporally controlled by the method according to the invention, then a DC voltage component of the differential voltage between the plate line and the relevant column line tends toward zero. The differential voltage now contains only a pure AC voltage component, i.e. a connected storage capacitor is in each case charged and discharged again by the same amount during an access cycle.

An existing DC voltage component can be calculated mathematically by integration of the differential voltage between the plate line and the corresponding column line over time. If this integral has a value which tends toward zero at the end of the access cycle, then the differential voltage has no DC voltage component.

By way of example, the shortest possible period of time from a technical standpoint is chosen as the period of time between the first instant and the third instant. In other words, the control of the temporal sequence during a memory access is set only by a corresponding choice of the first instant.

In accordance with an added mode of the invention, there is the step of setting the initial potential to be a reference-ground potential of the integrated memory.

In accordance with another mode of the invention, the access to the memory cell to be selected is a read access for reading out a data signal of the memory cell.

Other features which are considered as characteristic for the invention are set forth in the appended claims.

Although the invention is illustrated and described herein as embodied in a method for operating an integrated memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
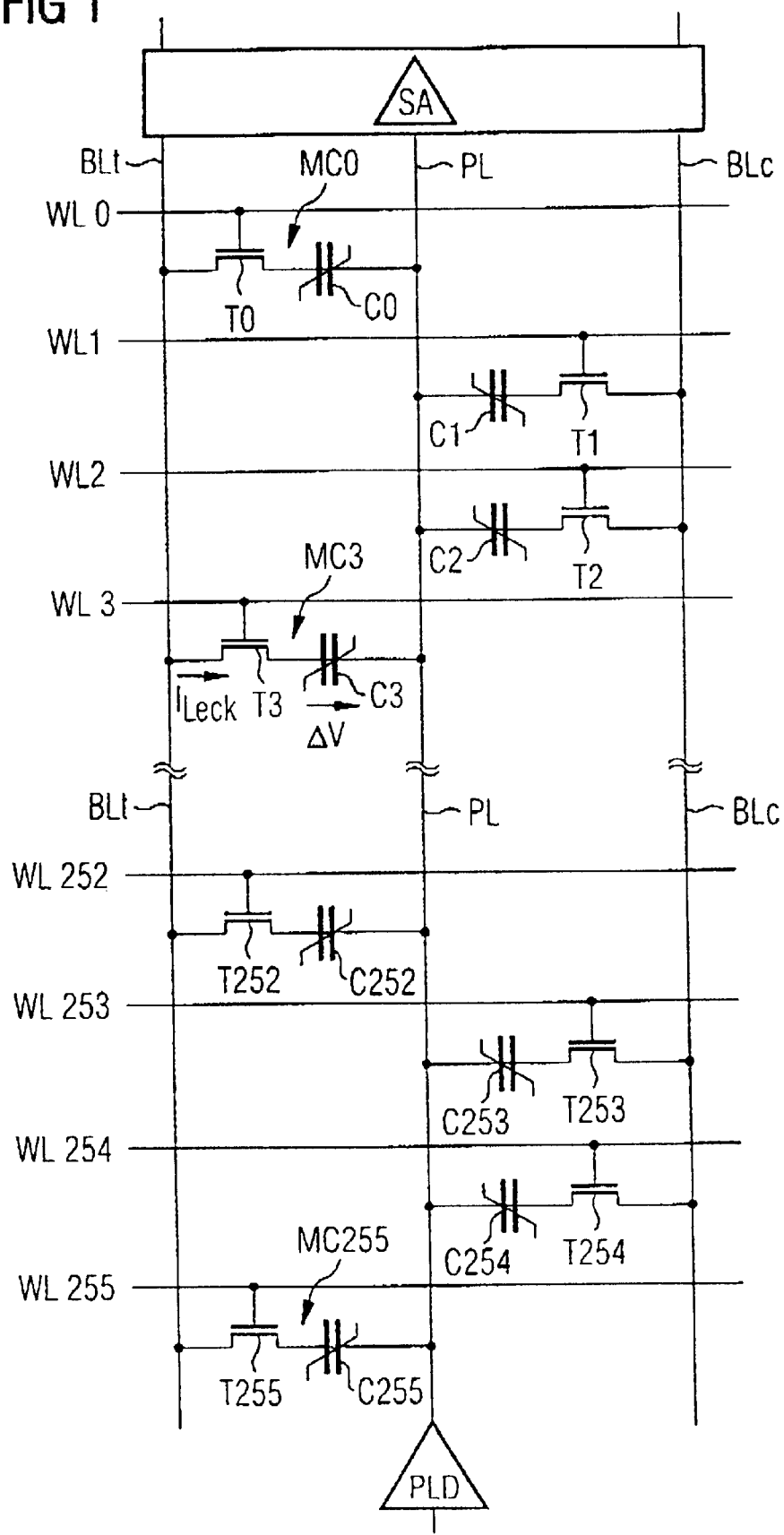
FIG. 1 is a circuit diagram of an integrated ferroelectric memory.

In all the figures of the drawing, sub-features and integral parts that correspond to one another bear the same reference symbol in each case. Referring now to the figures of the drawing in detail and first, particularly, to FIG. 1 thereof, there is shown a schematic illustration of an embodiment of an integrated ferroelectric memory. The latter has what are referred to as 1-transistor/1-capacitor memory cells MC disposed at crossover points between a respective bit line pair BLt, BLc and word lines WL0 to WL255. A plate line PL runs between the two bit lines BLt and BLc. The bit lines BLt, BLc or column lines are connected to a sense amplifier SA. The plate line PL is connected to a driver circuit PLD through which the plate line PL is present at a predetermined potential. The memory cells MC each have one selection transistor T0 to T255 and one storage capacitor C0 to C255. The storage capacitors C are storage capacitors with a ferroelectric storage effect. The plate line PL is connected to the column line BLt for example via the series circuit containing the selection transistor T0 and the storage capacitor C0 of the memory cell MC0. Control terminals of the selection transistors T0 to T255 of the memory cells MC are connected to a respective one of the row lines or word lines WL0 to WL255.

An exemplary read access of the memory shown in FIG. 1 is explained in more detail below. The method according to the invention can likewise be applied analogously to a write cycle of the integrated memory.

Figure 2:
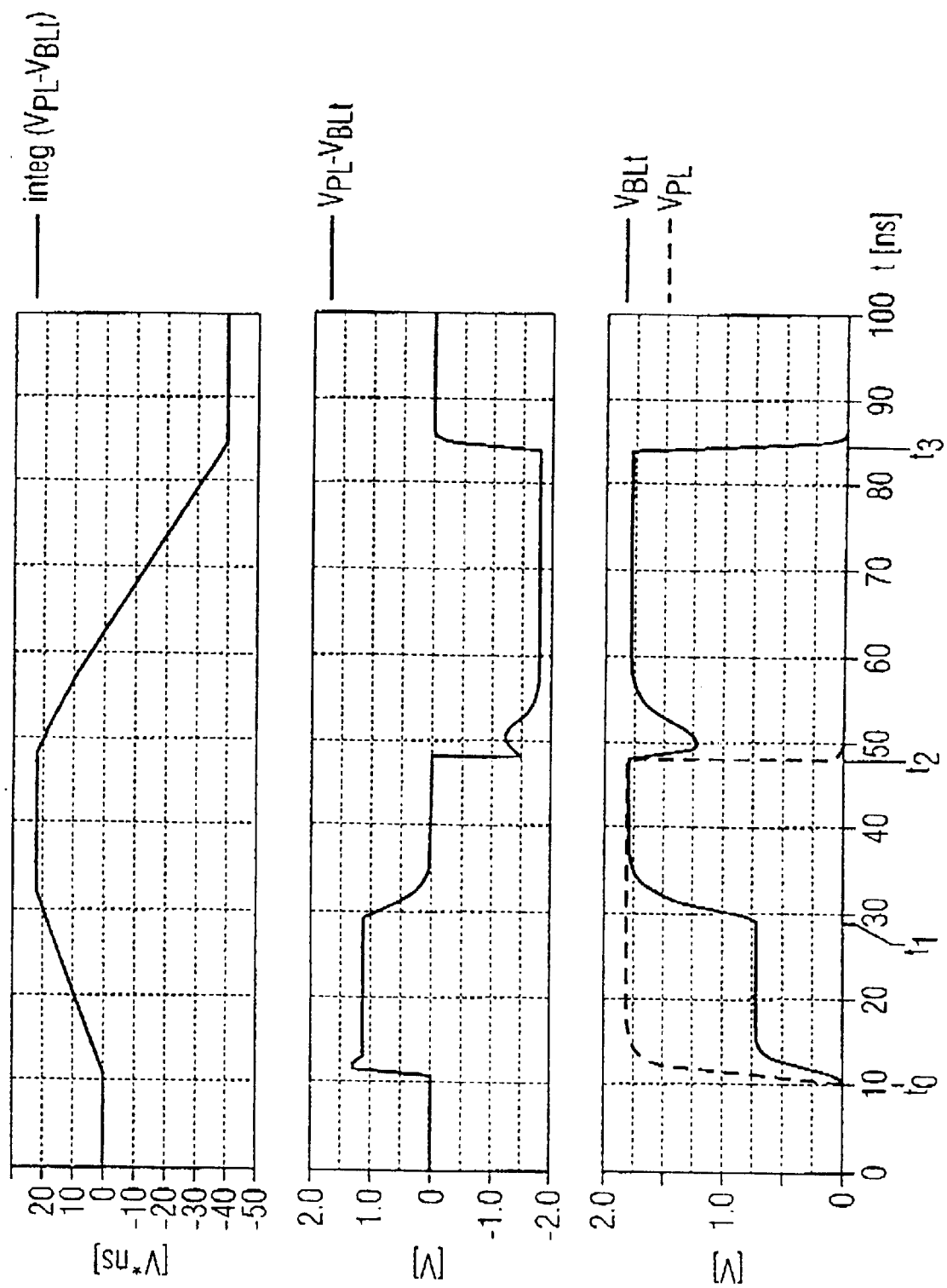
FIG. 2 is a graph of a temporal sequence of a read cycle of the integrated memory.

During a read access of the memory, the potential profiles VBLt and VPL shown in FIG. 2 occur on the bit line BLt and the plate line PL. It is assumed that the memory cell MC0 is activated. Prior to the read access, the column line BLt and the plate line PL which are connected to the memory cell MC0 to be selected are at an initial potential. In this example, the initial potential is a reference-ground potential of the integrated memory. The selection transistor T0 is switched on at the beginning of the read access by a positive potential present on the word line WL0. The row line WL0 is activated for this purpose. At the same time, a positive potential VPL is applied to the plate line PL, the potential being different from the potential VBLt of the column line BLt. This instant is identified as the instant t0.

A read voltage is then established on the bit line BLt in accordance with the information stored in the memory cell MC0. The read signal is compared with a reference voltage and evaluated and amplified in the connected sense amplifier SA. This instant is identified as the instant t1. After a certain period of time required for writing the information back to the memory cell MC0, the plate line PL is once again put at the initial potential. This instant is identified as the instant t2. After a further waiting time, the bit line BLt is also put at the initial potential at the instant t3. At the end of the read cycle, the word line WL0 is deactivated and the selection transistor T0 is thus non-conducting again. This operating mode of a ferroelectric memory is also referred to as "pulsed plate concept". FIG. 2 shows typical signal profiles for an access of this type.

There are connected to the bit line BLt and the plate line PL further memory cells MC which are not activated in the access cycle described above. In other words, their words lines WL are not activated, as a result of which the associated selection transistors are non-conducting. During the access cycle, the differential voltage VPL–VBLt shown in FIG. 1 is present across the respective source-drain path of these selection transistors. The source-drain voltage can cause a leakage current which charges and discharges the associated storage capacitor.

Integration of the differential voltage over time reveals that the differential voltage contains a DC voltage component in the case shown here (represented in FIG. 2 by the integral of the differential voltage integ(VPL–VBLt) not equal to zero at the end of the access cycle). The effect of this DC voltage component is, then, that, during each access cycle, the unselected storage capacitors are charged by a certain quantity of charge by leakage currents. This quantity of charge $\Delta Q$ is proportional to the product of the leakage current $I_{Leakage}$ and the integral of the difference between the potentials of the plate line PL and of the bit line BLt over time.

Therefore, after each access cycle, the voltage present at the terminals of the respective storage capacitor increases by an amount $\Delta V$, which is likewise proportional to the product of leakage current $I_{Leakage}$ and the integral of the differential voltage over time ($\Delta V \sim I_{Leakage} \cdot integ(VPL-VBLt)$). This potential increase $\Delta V$, which is illustrated by way of example on the storage capacitor C3, attenuates or destroys the information stored in the memory cell MC3 on account of the leakage current $I_{Leakage}$ of the selection transistor T3 over time, for example over a plurality of access cycles.

Figure 3:
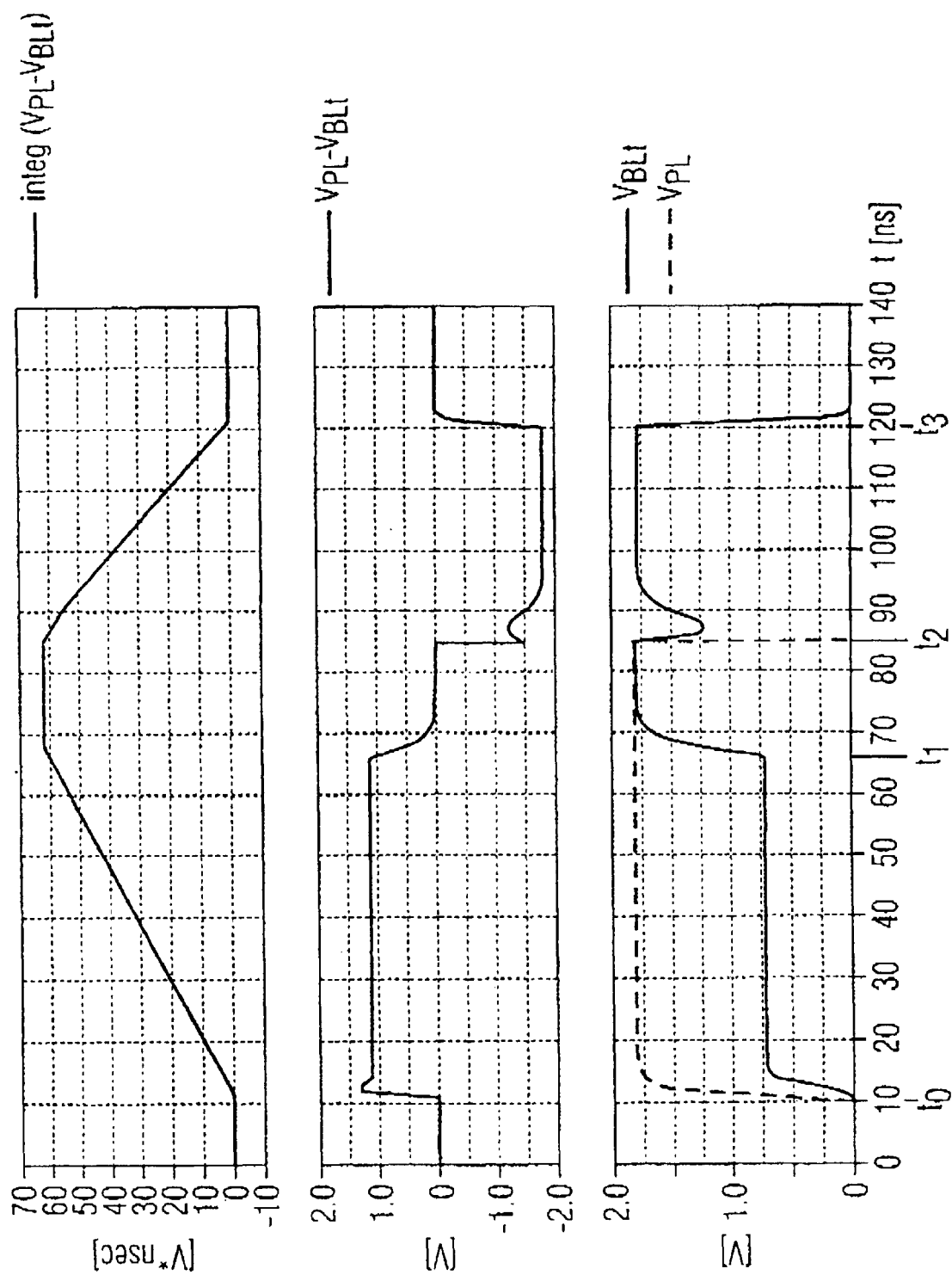
FIG. 3 is a graph of the temporal sequence of the read cycle according to the invention.

FIG. 3 shows an exemplary temporal sequence of a read cycle which is carried out by the method according to the invention. As can be gathered from FIG. 3, the temporal sequence is modified in such a way that the integral of the difference between the potentials of the plate line PL and the bit line BLt over time now tends toward zero. In other words, the DC voltage component of the differential voltage VPL–VBLt tends toward zero. Thus, the differential voltage now contains only a pure AC voltage component. Therefore, although one of the inactive storage capacitors is charged by a certain amount by an existing source-drain leakage current during an access cycle, it is discharged again by the same amount in the same cycle.

In FIG. 3, the operation of the memory was chosen such that the period of time between the instant t1 and the instant t3 constitutes the shortest possible period of time from a technical standpoint, in order to correspondingly process the signals. In comparison with the profile according to FIG. 2, the instant t1 was chosen such that the period of time between the instant t0 and t1 is correspondingly lengthened.

The absolute values of the time and of the respective voltage which are shown in FIGS. 2 and 3 are exemplary values. Since the voltage values and charge values at the respective memory cells are greatly dependent on design and technology, these may fluctuate within a comparatively large range.

We claim:

1. An operating method, which comprises the steps of:

providing an integrated memory having a memory cell array of memory cells, column lines, and row lines, the memory cells have selection transistors and storage capacitors with a ferroelectric storage effect, the integrated memory further having a plate line connected to one of the column lines through a series circuit containing a selection transistor and a storage capacitor of each of the memory cells, the selection transistors have control terminals each connected to a respective one of the row lines, and the memory cells can be accessed in an access cycle;

prior to an access, setting a column line and the plate line connected to a memory cell to be selected to an initial potential;

during the access, activating a row line connected to the memory cell to be selected, with a result that the selection transistor of the memory cell is switched on;

applying a further potential to the plate line, the further potential being different from the initial potential of the column line;

evaluating and amplifying a potential present on the column line at a first instant;

applying the initial potential to the plate line at a second instant;

applying the initial potential to the column line at a third instant; and choosing the first instant, the second instant and the third instant such that, in the access cycle, the storage capacitor of the memory cell to be selected is in each case charged and discharged by an equivalent amount.

2. The method according to claim 1, which comprise setting the initial potential to be a reference-ground potential of the integrated memory.

3. The method according to claim 1, wherein the access to the memory cell to be selected is a read access for reading out a data signal of the memory cell.

* * * * *